US008995684B2

(12) United States Patent
Kim et al.

(10) Patent No.: US 8,995,684 B2
(45) Date of Patent: Mar. 31, 2015

(54) APPARATUS AND METHOD FOR POST-PROCESSING AND OUTPUTTING DIGITAL AUDIO DATA IN REAL TIME

(75) Inventors: Ki-Mo Kim, Seoul (KR); Tae-Young Lee, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 258 days.

(21) Appl. No.: 13/430,248

(22) Filed: Mar. 26, 2012

(65) Prior Publication Data

US 2012/0183146 A1 Jul. 19, 2012

Related U.S. Application Data

(62) Division of application No. 11/856,286, filed on Sep. 17, 2007, now abandoned.

(30) Foreign Application Priority Data

Sep. 28, 2006 (KR) ........................ 10-2006-0094757

(51) Int. Cl.
*H03G 3/00* (2006.01)
*H04H 60/04* (2008.01)
*H04H 20/47* (2008.01)

(52) U.S. Cl.
CPC .................................... *H04H 60/04* (2013.01)
USPC ............................................... 381/104; 381/2

(58) Field of Classification Search
CPC ......... H04H 60/04; H04S 3/008; H03G 3/002
USPC ............. 381/2, 102, 104, 107, 109, 6, 10, 11, 381/12, 14, 17, 300, 57, 58, 59; 700/94; 369/4, 5; 386/E5.024; 377/69
See application file for complete search history.

(56) References Cited

U.S. PATENT DOCUMENTS 5,668,785 A * 9/1997 Monta ............................... 369/5
6,405,092 B1 * 6/2002 Oxford ........................... 700/94
6,628,999 B1 * 9/2003 Klaas et al. ..................... 700/94

* cited by examiner

*Primary Examiner* — Vivian Chin
*Assistant Examiner* — Ammar Hamid
(74) *Attorney, Agent, or Firm* — F. Chau & Associates, LLC

(57) ABSTRACT

A digital audio data output device having first and second post-processors that process received digital audio data in parallel. Each processor includes a mixer unit that processes received digital audio data on the fly in response to a channel mode control signal, and a volume control unit that adjusts volume level of output of the mixer unit on the fly in response to a volume level control signal. Each mixer unit includes first and second buffers that can respectively store first and second channel data, a calculator that calculates mix data from the outputs of the buffers, a third buffer that stores the mix data, and an output unit. The output unit selects and outputs one of the received digital audio data, the output of the first buffer, the output of the second buffer, the mix data, and output of the third buffer, as the output of the mixer unit.

8 Claims, 5 Drawing Sheets

APPARATUS AND METHOD FOR POST-PROCESSING AND OUTPUTTING DIGITAL AUDIO DATA IN REAL TIME

CROSS-REFERENCE TO RELATED APPLICATIONS

This application is a divisional of U.S. patent application Ser. No. 11/856,286, filed on Sep. 17, 2007, which claims priority under, 35 USC §119, of Korean Patent Application No. 2006-94757, filed on Sep. 28, 2006 in the Korean Intellectual Property Office (KIPO), the disclosures of which are each all incorporated herein by reference in their entirety.

BACKGROUND OF THE INVENTION

1. Field of the Invention

The present invention relates to a digital audio signal output device, and more particularly to a post processor for processing digital audio data on the fly (in real time), a digital audio data output device including the post-processor, and a method of outputting digital audio data.

2. Description of the Related Art

A conventional digital audio data output device outputs audio data in various formats. The conventional digital audio data output device typically processes the digital audio data using a high performance digital signal processor (DSP) and outputs processed digital audio data.

FIG. 1 is a block diagram illustrating a conventional digital audio data output device.

The digital audio data output device 100 includes an input unit 101, a first memory 102, a DSP core 103, a second memory 104 and transmitters 105 and 106. The input unit 101 may receive the digital audio data in stereo mode as two channel data. The first memory 102 may be a first FIFO memory and stores (buffers) the digital audio data temporarily. The DSP core 103 processes the digital audio data stored in the first memory 102. The second memory 103 may be a second FIFO memory and temporarily stores (buffers) the digital audio data processed by the DSP core 103. The transmitters 105 and 106 transmit the processed (stereo) digital audio data according to a predetermined transmission mode.

The DSP core 103 reads (stereo) digital audio data stored in the first memory 102 and processes the digital audio data in mono mode (such as single left channel mode, single right channel mode), or in mix (stereo) mode. The DSP core 103 adjusts volume level per channel of digital audio data. The DSP core 103 may perform mute operations according to mute setting.

The DSP core 103 included in the conventional digital audio data output device 100 performs not only processing of digital audio data but also operations requested by other circuits (not shown).

When many devices request the DSP core 103 for digital audio data of different channel mode and different volume, the amount of processing operations (computations per second) for processing the digital audio data increases. For example, when the first transmitter 105 is required to output digital audio data in stereo mode, and the second transmitter 106 is required to output digital audio data in mix mode, the DSP core 103 needs to perform both operations simultaneously for generating the digital audio data to be outputted from the first transmitter 105 and the digital audio data to be outputted the second transmitter 106.

When operations requested by other circuits increase, or digital audio data needs to be processed for many devices, the DSP core 103 may not be able to process all the buffered (in first memory 102) digital audio data on the fly (in real time, without significant delay).

The transmitters 105 and 106 use digital audio data stored in the second memory 104, because the transmitters 105 and 106 may not immediately transmit the digital audio data processed and output by the DSP core 103.

As described above, much time (delay) and a large amount of buffer memory may be required to process and output the digital audio data in the conventional digital audio data output device.

SUMMARY OF THE INVENTION

An aspect of the invention provides a digital audio data output device having first and second post-processors configured to process received digital audio data in parallel. Each processor includes a mixer unit configured to process received digital audio data on the fly in response to a channel mode control signal, and a volume control unit configured to adjust volume level of output of the mixer unit on the fly in response to a volume level control signal. Where the digital audio data corresponds to stereo (two channel) data, each mixer unit includes first and second buffers configured to respectively store the first and second channel data in the two channel data, a calculator configured to calculate mix data from the outputs of the first and second buffers, a third buffer configured to store the mix data, and an output unit. The output unit is configured to select and output one of the received digital audio data, the output of the first buffer, the output of the second buffer, the mix data, and output of the third buffer, as the output of the mixer unit.

Some exemplary embodiments of the present invention provide a post-processor that can process digital audio data on the fly (in real time). The terms "on the fly" as in the phrase "to process digital audio data on the fly" means "to process digital audio data directly without repeating memory access operations to memory addresses such as, for example, reading the digital audio data from a first address of a memory and then writing the digital audio data to a second address of the memory or of a second memory after performing operations on the digital audio data".

Some exemplary embodiments of the present invention provide a digital audio data output device that can process digital audio data on the fly, and then output processed digital audio data.

Some exemplary embodiments of the present invention provide a method of processing digital audio data on the fly and then outputting the processed digital audio data.

In some exemplary embodiments of the present invention, a post-processor for processing digital audio data includes a mixer and a volume control unit. The mixer unit processes the received digital audio data on the fly in response to a channel mode control signal. The volume control unit adjusts the volume level of the output of the mixer unit on the fly in response to a volume level control signal.

The received digital audio data may correspond to PCM data or two channel data. The output of the mixer unit may correspond to one of stereo data, single right channel data, single left channel data and mix data.

The mixer unit may include first and second buffers, a calculator, a third buffer and an output unit. The first and second buffers store the two channel data. The calculator calculates mix data based on the output of the first buffer and the output of the second buffer. The third buffer stores the mix data. The output unit selects one of the two channel data, the output of the first buffer, the output of the second buffer, the mix data, and output of the third buffer, to output the selected data.

The first buffer may store the two channel data in synchronization with a clock signal. The second buffer may store the output of the first buffer in synchronization with the clock signal. The third buffer may store the mix data in synchronization with the clock signal.

The volume control unit may gradually adjusts (increments or decrements) the current volume level of the output of the mixer unit to reach the target volume level that is determined in response to the volume level control signal.

The volume control unit may include a current volume register, a target volume register, a current volume level update unit and a scaler. The current volume register may store the current volume level. The target volume register may store the target volume level. The current volume level update unit may increase or decrease the current volume level by predetermined units of volume (steps, volume increments) until the current volume level corresponds to the target volume level. The scaler may scale the output of the mixer unit according to the current volume level.

The scaler may include sequential multiplier configured to multiply the output of the mixer unit by the current volume level.

The scaler may include an adder, a register, a shifter and a control unit. The adder may perform an addition operation on first and second inputs of the adder in synchronization with a bit clock. The register may store the output of the adder in synchronization with the bit clock. The shifter may perform 1-bit right shift upon the output of the adder in synchronization with the bit clock. The control unit may determine the first and second inputs of the adder according to each bit of the current volume level in sequence of LSB to MSB. The output of the mixer unit, and the output of the shifter or '0' may be inputted to the adder when the each bit of the current volume level corresponds to '1'. '0', and the output of the shifter or '0' may be inputted to the adder when the each bit of the current volume level corresponds to '0'. The control unit may select '0' instead of the output of the shifter for input data of the adder until the each bit of the current volume level corresponds to '1'. The control unit may select the output of the shifter instead of '0' for input data of the adder after the each bit of the current volume level corresponds to '1'.

In some exemplary embodiments of the present invention, a digital audio data output device includes an input unit, a memory, a plurality (e.g., two) of post-processors and a plurality (e.g., two) of transmitters. The input unit receives digital audio data. The memory stores the digital audio data temporarily. The plurality of post-processors read the digital audio data from the memory and process the digital audio data. The plurality of transmitters may output the processed digital audio data in a predetermined transmission mode.

Each of the post-processors may include a mixer unit and a volume control unit. The mixer unit may process the digital audio data on the fly in response to a channel mode control signal. The volume control unit may adjust volume level of the output of the mixer unit on the fly in response to a volume level control signal.

The digital audio data may correspond to PCM data or two channel data

In case that the digital audio data corresponds to two channel data, the mixer unit may include first and second buffers, a calculator, a third buffer and an output unit. The first and second buffers may respectively store first and second channel data of the two channel data. The calculator may calculate mix data from the output of the first buffer and the output of the second buffer. The third buffer may store the mix data. The output unit (e.g., multiplexer) may select and output one of the two channel data, the output of the first buffer, the output of the second buffer, the mix data and output of the third data as the output of the mixer unit.

The volume control unit may include a current volume register, a target volume register, a current volume level update unit and a scaler. The current volume register may store current volume level. The target volume register may store target volume level. The current volume level update unit may increment or decrement the current volume level until the current volume level corresponds to the target volume level. The scaler may scale the output of the mixer unit according to the current volume level.

The scaler may include a sequential multiplier configured to multiply the output of the mixer unit by the current volume level.

The scaler may include an adder, a register, a shifter and a control unit. The adder may perform an addition operation upon first and second inputs of the adder in synchronization with a bit clock. The register may store the output of the adder in synchronization with the bit clock. The shifter configured to perform 1-bit right shift the output of the adder in synchronization with the bit clock. The control unit may determine the first and second inputs of the adder according to each bit of the current volume level in sequence of LSB to MSB. The output of the mixer unit, and the output of the shifter or '0' may be inputted to the adder when the each bit of the current volume level corresponds to '1'. '0', and the output of the shifter or '0' may be inputted to the adder when the each bit of the current volume level corresponds to '0' The control unit may select '0' instead of the output of the shifter for input data of the adder until the each bit of the current volume level corresponds to '1'. The control unit may select the output of the shifter instead of '0' for input data of the adder after the each bit of the current volume level corresponds to '1'.

In some exemplary embodiments of the present invention, a method of outputting received digital audio data includes setting a channel mode and a target volume level, storing the digital audio data in a memory, processing the digital audio data on the fly according to the channel mode, adjusting a volume level of the digital audio data on the fly according to the target volume level, and outputting the digital audio data having the adjusted volume level in a predetermined transmission mode.

Adjusting the volume level may include comparing the current volume level with the target volume level, updating the current volume level by incrementing or decrementing the current volume level until the current volume level corresponds to the target volume level, and scaling the volume level of the digital audio data according to the current volume level.

Scaling volume level of the digital audio data may include multiplying the processed digital audio data by the current volume level.

Therefore, time delay and memory space for processing digital audio data may be reduced.

Embodiments of the present invention now will be described more fully below with reference to the accompanying drawings, in which exemplary embodiments of the invention are shown. This invention may, however, be embodied in many different forms and should not be construed as limited to the embodiments set forth herein. Rather, these exemplary embodiments are illustrated so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments and is not intended to be limiting of the invention. As used herein, the singular forms "a," "an" and "the" are intended to include the plural forms as well, unless the context clearly indicates otherwise.

BRIEF DESCRIPTION OF THE DRAWINGS

The above and other features of the present invention will become more apparent to persons skilled in the art by describing in detail exemplary embodiments thereof with reference to the attached drawings in which.

DETAILED DESCRIPTION OF EXEMPLARY EMBODIMENTS OF THE INVENTION

Figure 2:
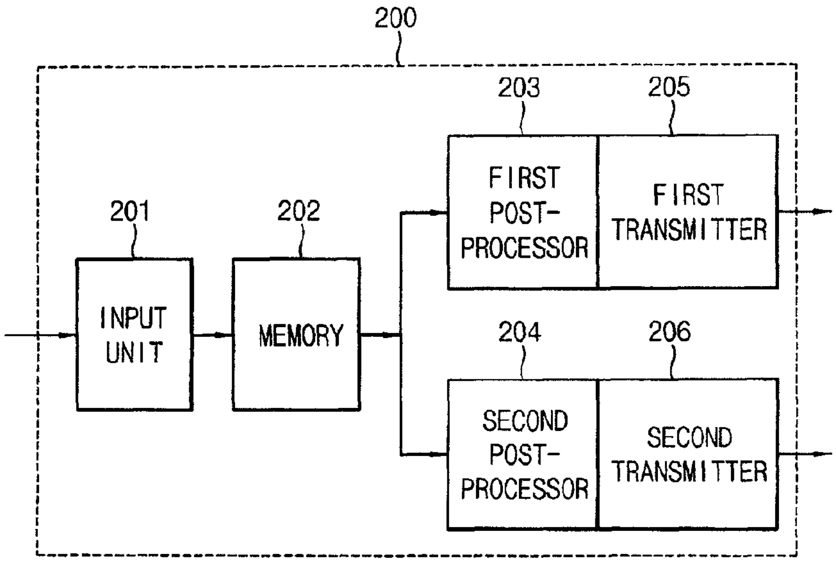
FIG. 2 is a block diagram of a digital audio data output device according to an exemplary embodiment of the present invention.

FIG. 2 is a block diagram of a digital audio data output device according to an exemplary embodiment of the present invention.

Figure 1:
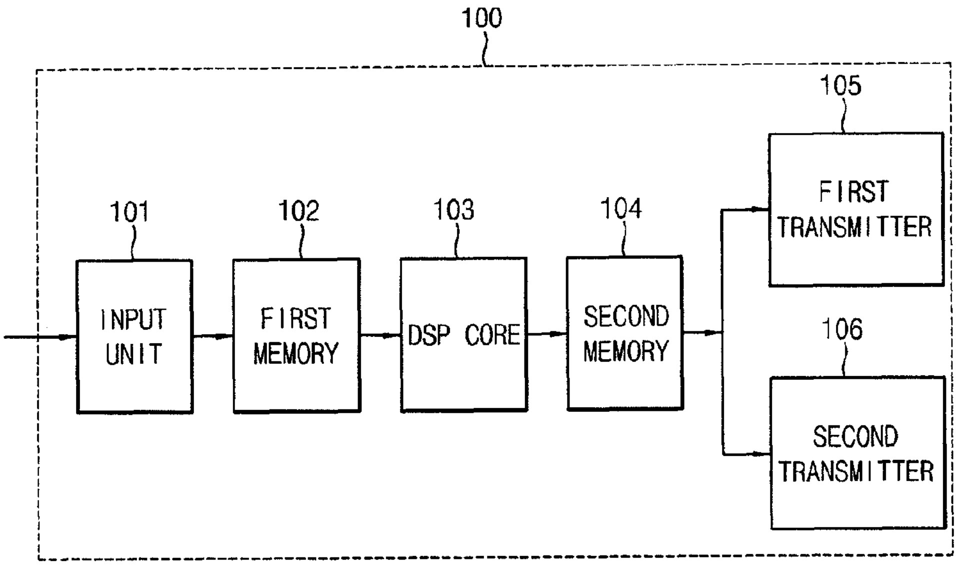
FIG. 1 (CONVENTIONAL ART)
FIG. 1 is a block diagram of a conventional digital audio data output device.

Referring to FIG. 2, the digital audio data output device 200 includes an input unit 201, a first (buffer) memory 202, a first post-processor 203, a second post-processor 204, a first transmitter 205 and a second transmitter 206. The exemplary digital audio data output device 200 does not include a second (buffer) memory as found in the conventional digital audio data output device 100 of FIG. 1. The digital audio output device 200 processes digital audio data using post-processors 203 and 204 (shown in greater detail as 300 in FIG. 3).

The input unit 201 receives audio PCM (Pulse Code Modulation) data in stereo mode provided from outside of the digital audio data output device 200. The audio PCM data are initially stored (buffered) in the input-buffer memory 202. The input-buffer memory 202 may be smaller than the first buffer memory 102 in FIG. 1, because of the greater throughput (e.g., post-processing speed) of the digital audio data output device 200 of FIG. 2. The input-buffer memory 202 may be a first-in-first-out (FIFO) memory. The digital audio data output device 200 may receive the audio PCM data in stereo mode and separately process the audio PCM data in parallel as illustrated in FIG. 2. The digital audio data output device 200 may, however, be implemented to process data of various types. For example, the digital audio data output device 200 may be implemented to receive and process audio PCM data having 5.1 channels instead of the to audio PCM data in stereo mode. It will be easily understood to those skilled in the art that the digital audio data output device may be implemented to receive and process various types of audio data.

The first post-processor 203 reads the stored audio PCM data and processes the audio PCM data in response to a channel control signal and a volume control signal. (not shown in FIG. 2, see channel mode control signal 302 and volume level control signal 303, in FIG. 3) The first post-processor 203 provides the processed audio PCM data to the first transmitter 205.

Figure 3:
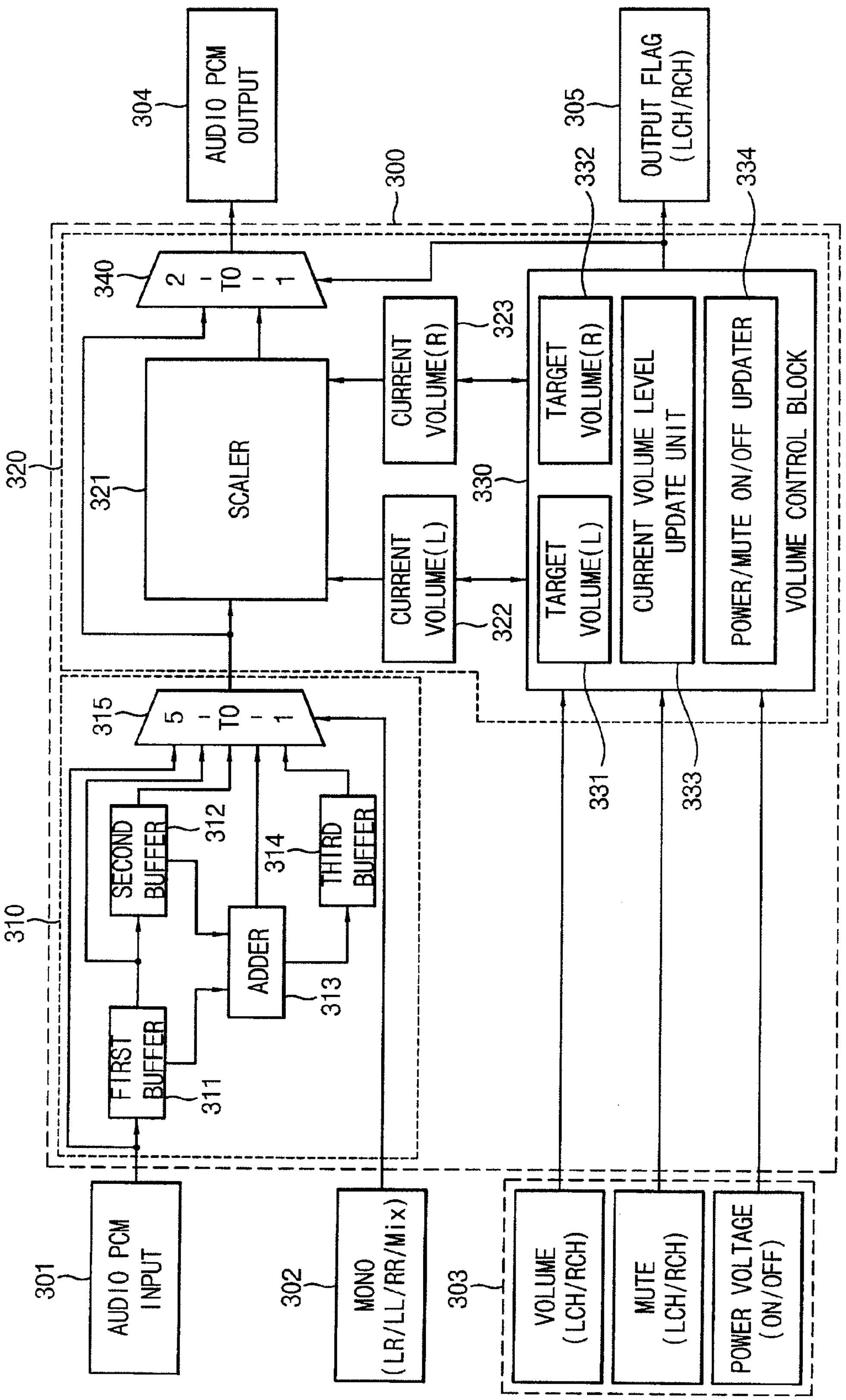
FIG. 3 is a block diagram of an exemplary post-processor 300 (e.g., 203 or 204 in FIG. 2) for processing the digital audio data on the fly according to an exemplary embodiment of the present inventions.

The second post-processor 204 reads the stored (buffered in input-buffer memory 202) audio PCM data and processes the audio PCM data in response to the channel control signal (302 in FIG. 2) and the volume control signal (303 in FIG. 3). The second post-processor 204 provides the processed audio PCM data to the second transmitter 206.

The channel mode or the volume level of audio PCM data provided to the first transmitter 205 may be identical to or different from the channel mode or the volume level of audio PCM data provided to the second transmitter 206. For example, audio PCM data provided to the first transmitter 205 may correspond to data processed in stereo channel mode, and audio PCM data provided to the second transmitter 206 may correspond to data processed in mono channel mode.

The first transmitter 205 outputs audio PCM data processed by the first post-processor 203. The second transmitter 206 outputs audio PCM data processed by the second post-processor 204. In one alternative embodiment, the first transmitter 205 and the second transmitter 206 output the audio PCM data processed by the first post-processor 203 and the second post-processor 204 in serial transmission mode.

FIG. 3 is a block diagram of an exemplary post-processor 300 (e.g., for implementing either one of 203 and 204 shown in FIG. 2) for processing the digital audio data according to an exemplary embodiment of the present invention.

The design of the post-processor 300 in FIG. 3 may be used for either one or both of the post-processors 203 and 204 in the digital audio data output device 200 of FIG. 2.

The post-processor 300 includes a mixer unit 310 and a volume control unit 320. The mixer unit 310 processes digital audio data 301 on the fly in response to a channel mode control signal 302. The volume control unit 320 adjusts volume level of the output of the mixer unit 310 on the fly in response to a volume level control signal 303. The volume control unit 320 adjusts the volume level of the output of the mixer unit 310 and outputs the processed audio PCM data 304 having an adjusted volume level.

The mixer unit 310 includes a first buffer 311, a second buffer 312, an adder 313, a third buffer 314, and an output unit (e.g., multiplexer) 315 to process the audio PCM data 301 in stereo mode (LR) or mono mode (LL, or RR) based upon the received channel mode control signal 302.

The audio PCM data 301 may correspond to two channel data including single left channel data (LL) and single right channel data (RR). The audio PCM data 301 inputted to the mixer unit 310 are stored in the first buffer 311 and then the second buffer 312.

The adder 313 adds the output of the first buffer 311 and the output of the second buffer 312 to generate mix data. The adder 313 stores the mix data in the third buffer 314 or outputs the mix data through the output unit (multiplexer) 315. The post-processor 300 in FIG. 3 generates the mix data using the adder 313. The post-processor 300, however, may use various other types of data manipulators or calculators. For example, the mix data may be generated using a calculator configured to average the output of the first buffer 311 and the output of the second buffer 312 instead of the adder 313. Similarly, the output of the adder 313 may be divided by 2 before being stored in the third buffer 314.

The output unit (multiplexer) 315 selects one of the received audio PCM data, the output of the first buffer 311, the output of the second buffer 312, the output of the adder 131 and the output of the third buffer 314 and outputs the selected data. Operations of the mixer unit 310 will be described in greater detail with reference to FIG. 4.

Figure 4:
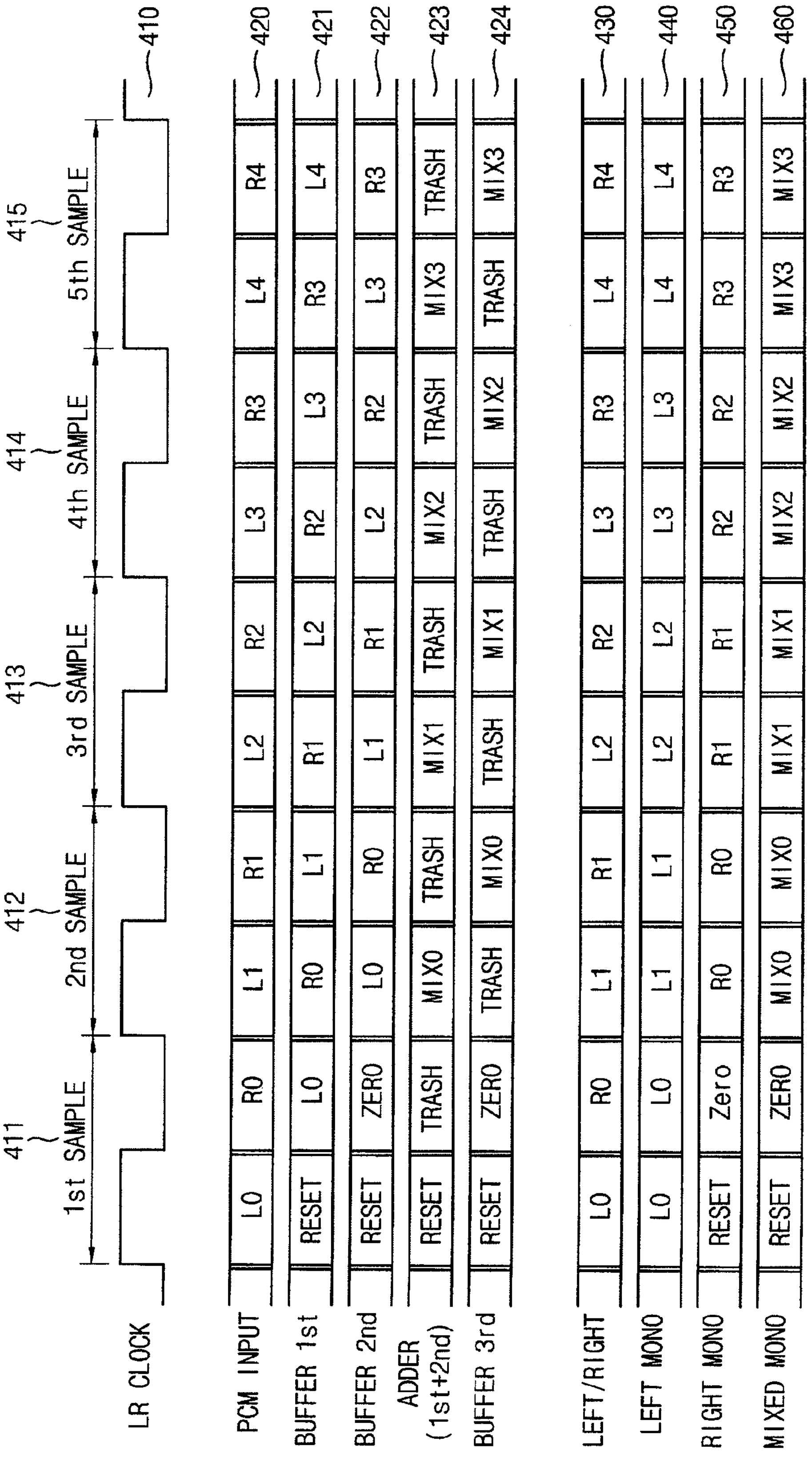
FIG. 4 is a diagram illustrating operations of the mixer unit 310 in the post-processor 300 of FIG. 3.

FIG. 4 is a timing diagram illustrating operations of the mixer unit 310 in the post-processor 300 of FIG. 3.

Referring to the labels of signals in FIG. 4, channel modes may include stereo mode (LEFT/RIGHT) and mono mode (LEFT MONO, or RIGHT MONO). The mono mode may include single left channel mode (LEFT MONO), single right channel mode (RIGHT MONO) and mix mode (MIXED MODE).

A clock signal (LR CLOCK) 410 may be an externally received reference signal for synchronously receiving the audio PCM data 420. Thus, two bits of the audio PCM data 420 may be received during each one clock cycle of the clock signal 410.

The buffers and the adder are initially in RESET state, e.g., "0", "ZERO". Thus, the output of the first buffer 421, the output of second buffer 422, the output of the adder 423 and the output of the third buffer 424 may correspond to '0' which is the initial RESET value.

The first (311), second (312) and third (314) buffers (see FIG. 3) store received data in synchronization with falling and rising edges of the clock signal 410. More particularly, the first buffer 311 stores the audio PCM data 420 in synchronization with the falling and rising edges of the clock signal 410. The second buffer 312 stores the output of the first buffer 421 in synchronization with the falling and rising edges of the clock signal 410. The third buffer 314 stores the output 423 of the adder in synchronization with the falling and rising edges of the clock signal 410.

Hereinafter, operations of the first (311), second (312) and third (314) buffers (see FIG. 3) in synchronization with the clock signal (LR CLOCK) will be described in detail.

First left channel data L0 and first right channel data R0 are each sampled during a first sampling period 411.

The first buffer stores the first left channel data L0 in a falling edge of the clock signal in the first sampling period 411. Meanwhile, the second buffer still stores '0' (ZERO) corresponding to the RESET value stored in the first buffer at the same falling edge of the clock signal in the first sampling period 411. The third buffer stores '0' (ZERO) corresponding to the sum of (RESET, ZERO) values stored in the first and second buffers at the falling edge of the clock signal.

Second left channel data L1 and second right channel data R1 are each sampled during the second sampling period 412.

The first buffer stores the first right channel data R0 sampled at a rising edge of the clock signal in the second sampling period 412. The second buffer stores the first left channel data L0 stored in the first buffer at the same rising edge of the clock signal. The third buffer may store meaningless ("trash") value at the rising edge of the clock signal.

The first buffer stores the second left channel data L1, and second buffer stores the first right channel data R0 stored in the first buffer, at the falling edge of the clock signal in the second sampling period 412. The third buffer stores a first mix data MIX0 corresponding to the sum of the right left channel data R0 stored in the first buffer and the first left channel data L0 stored in the second buffer.

Third left channel data L2 and third right channel data R2 are each sampled during the third sampling period 413.

The first buffer stores the second right channel data R1, and the second buffer stores the second left channel data L1 stored in the first buffer, at the rising edge of the clock signal in the third sampling period 413. The third buffer stores meaningless ("trash") value at the rising edge of the clock signal.

The first buffer stores the third left channel data L2 and the second buffer stores the second right channel data R1 stored in the first buffer at the falling edge of the clock signal in the third sampling period 413. The third buffer stores a second mix data MIX1 corresponding to sum of the second right channel data R1 stored in the first buffer and the second left channel data L1 stored in the second buffer.

Likewise, the fourth left channel data L3 and fourth right channel data R3 are each sampled and buffered (and summed) during the fourth sampling period 414, the fifth left channel data L4 and fifth right channel data R4 are each sampled and buffered (and summed) during the fifth sampling period 415, and so forth.

In stereo mode, the output unit (multiplexer) 315 selects and outputs the audio PCM data 420. Thus, in stereo mode, the output signal 430 of the output unit (multiplexer) 315, includes two channel (LEFT/RIGHT) data corresponding to audio PCM data 420.

In single LEFT MONO channel mode, the output unit outputs the audio PCM data 420 sampled only at the rising edges of the clock signal 410. Then, the output unit (multiplexer) 315 selects and outputs the audio PCM data 420 at each rising edge of the clock signal 410 and selects and outputs data 421 of the first buffer at each next falling edge of the clock signal 410. Thus, in single LEFT channel mode, output signal 440 of the output unit (multiplexer) 315 includes only left channel data (e.g., L0, L1, L2, L3, L4).

In single RIGHT MONO channel mode, the output unit (multiplexer) 315 selects and outputs the output data 421 of the first buffer only at each rising edge of the clock signal 410. Next, the output unit (multiplexer) 315 selects and outputs the output data. 422 of the second buffer at each falling edge of the clock signal 410. Thus output signal 450 of the output unit (multiplexer) 315 includes only right channel data delayed one clock cycle relative to the output of output unit (multiplexer) 315 in single left channel mode.

In mix mode, the output unit (multiplexer) 315 selects and outputs the output data 423 of the adder only at each a rising edge of the clock signal 410. Next, the output unit (multiplexer) 315 selects and outputs the output data 424 of the third buffer at each falling edge of the clock signal 410. The resulting output signal 460 of the output unit (multiplexer) 315 includes only mix data delayed by one clock cycle relative to the output of output unit (multiplexer) 315 in single left channel mode.

Referring again to FIG. 3, the volume control unit 320 of the post-processor 300 includes a scaler 321, a volume control block 330 and current volume registers 322 and 323.

The current volume registers 322 and 323 store the current volume level of left and right channel audio data, respectively. The current volume register 322 stores left channel current volume level and the current volume register 323 stores right channel current volume level.

The scaler 321 multiplies the output of the mixer unit 310 by the respective current volume levels stored in the current volume registers 322 and 323. A more detailed description of the scaler 321 is provided below with reference to FIG. 6.

The output unit (multiplexer) 340 selects and outputs one of the (unscaled) output of the mixer unit 310 and the (scaled) output of the scaler 321 based upon a selection signal output by the volume control block 330.

The volume control block 330 includes target volume registers 331 and 332, a current volume level update unit 333 and a power/mute updater 334. The volume control block 330 sets the target volume levels of the target volume registers 331 and 332 in response to the left/right volume level control signal 303. The volume level control signal 303 includes signals for determining left and right channel volumes and signals for switching power/mute state.

The current volume level update unit 333 compares the current volume levels stored in the current volume registers 322 and 323 with the target volume levels stored in the target volume registers 331 and 332.

When either or both of the current volume levels are different from the respective target volume levels, the current volume level update unit 333 adjusts the current volume levels until both of the current volume levels correspond to the target volume levels.

The power/mute updater 334 resets the target volume level to a predetermined value (e.g., zero) in response to the power/mute control signal.

In one exemplary embodiment, in a soft volume control mode, the current volume level update unit 333 gradually increases or decreases the current volume level in predetermined step units (increments) of volume. The unit of volume of each adjustment step (volume increment) may correspond to about 1/1024 of the difference between the maximum volume level and the minimum volume level. The volume level update unit 333 adjusts the current volume level by one adjustment step (volume increment) in each (one) clock cycle. The soft volume control mode in which the volume level is adjusted gradually has several advantages over a non-soft volume control mode.

Figure 5A:
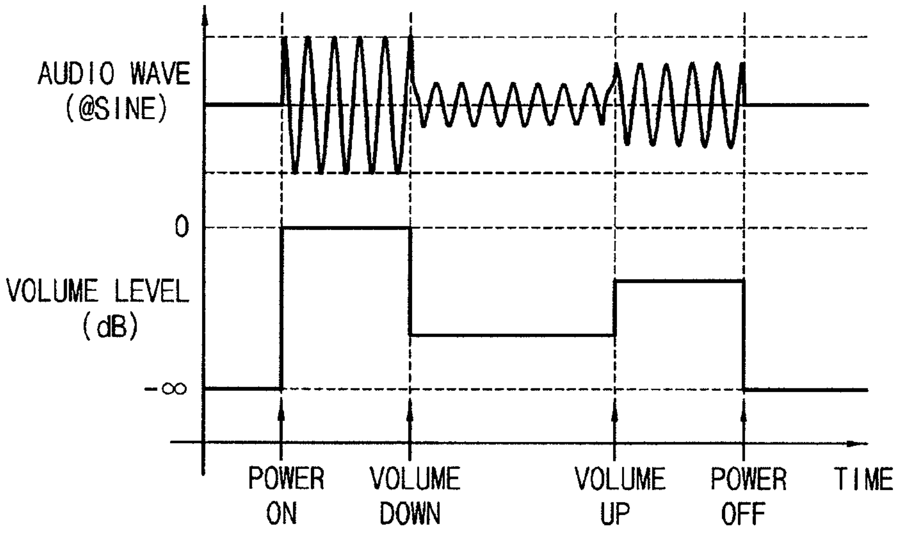
FIG. 5A is a waveform diagram illustrating the concept of non-soft volume control.
Figure 5B:
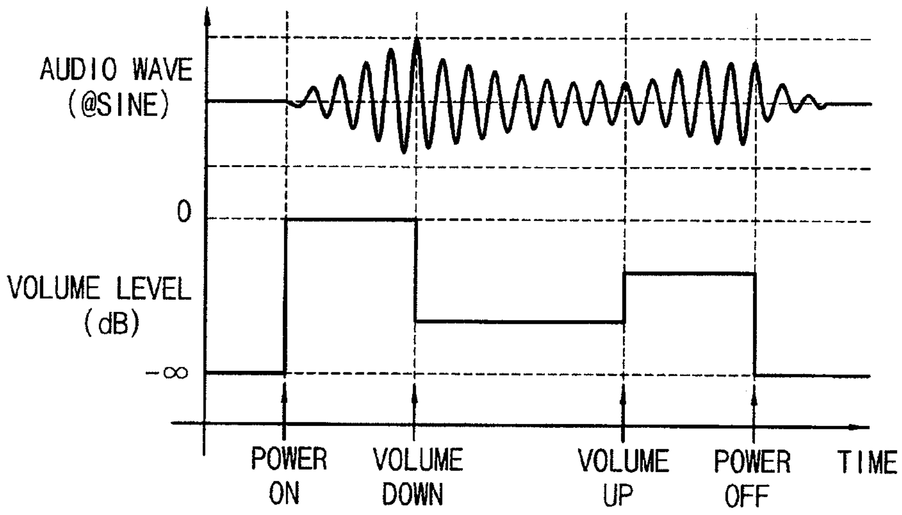
FIG. 5B is a waveform diagram illustrating the concept of soft volume control.

FIG. 5A is a waveform diagram illustrating the concept of non-soft volume control, and FIG. 5B is a waveform diagram illustrating the concept of soft volume control. Referring to FIG. 5A, in a non-soft volume control mode, when the target volume level changes, the output audio waveform changes rapidly, with rapid changes of amplitude (volume). Referring to FIG. 5B, in a soft volume control mode, when the target volume level changes, the output audio waveform changes gradually without rapid changes of amplitude (volume).

When the volume level changes rapidly, as in the non-soft volume control mode illustrated in FIG. 5A, audible "clicking" may occur. The audible clicking may also occur when turning on/off power or turning on/off mute. The audible clicking may degrade quality of audio data.

Figure 6:
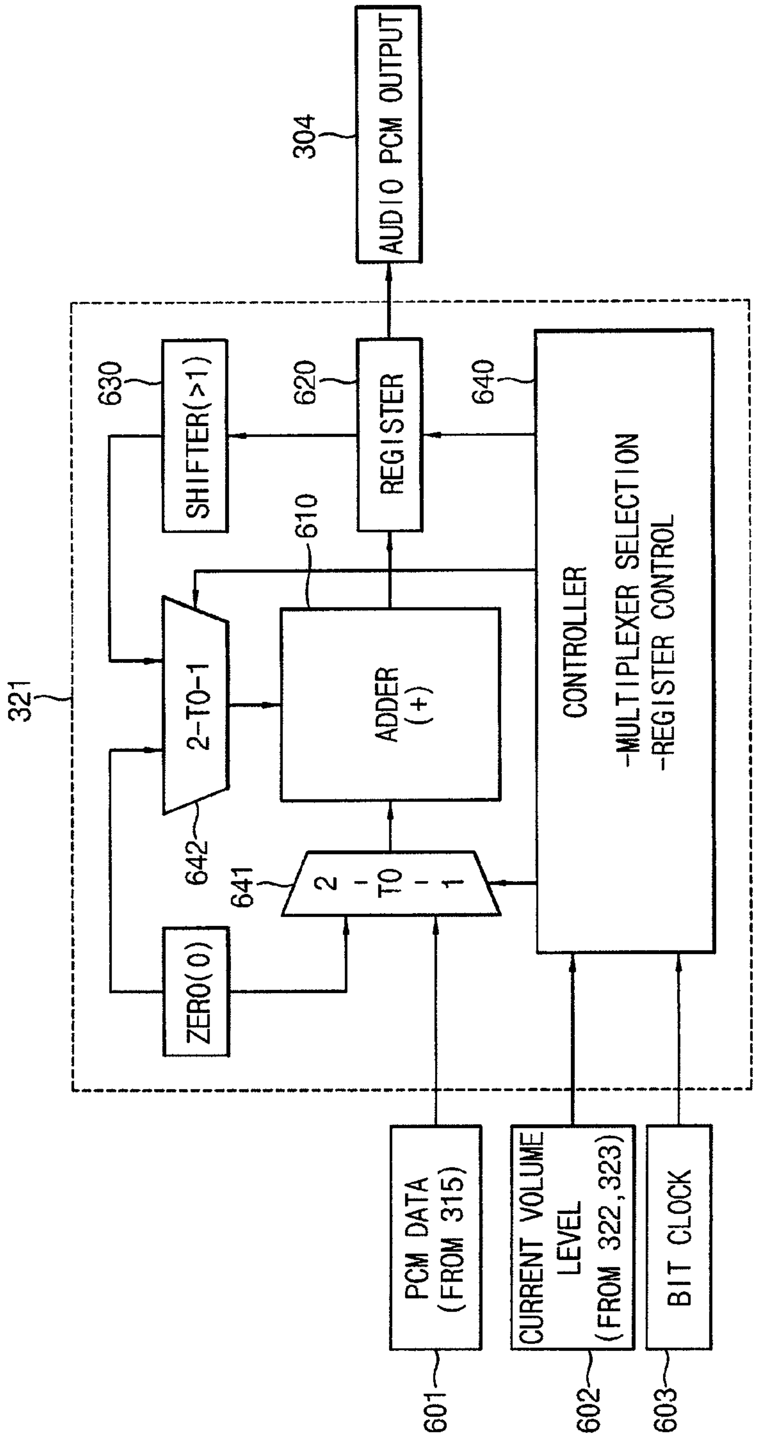
FIG. 6 is a block diagram of an exemplary implementation of the scaler 321 in the post-processor of FIG. 3.

FIG. 6 is a block diagram of an exemplary implementation of the scaler 321 in the post-processor 300 of FIG. 3.

The scaler 321 may be implemented with a sequential multiplier that multiplies the output of the mixer unit 310 by the current volume level 602. The sequential multiplier may be implemented with a shifter 630 and a register 620. Generally, the sequential multiplier has smaller hardware size than a parallel multiplier.

The scaler 321 includes an adder 610, a register 620, a shifter 630 and a control unit 640. The register 620 stores output of the adder 610 in synchronization with the bit clock 603. The shifter 630 repeatedly performs a 1-bit right shift upon the output of the adder 610 stored in the register 620 in synchronization with the bit clock 603. The control unit 640 controls the scaler 321.

The data input to the adder 610 are selected by first and second multiplexers 641 and 642 according to first and second selection signals output by the control unit 640. The output of the first multiplexer 641 is the first input to the adder 610, and the output of the second multiplexer 642 is the second input to the adder 610. The control unit 640 controls the output of the first multiplexer 641 and of the second multiplexer 642 according to each bit of the current volume level in sequence from LSB to MSB in synchronization with the bit clock 603. Each time a bit of the current volume level corresponds to '1', the first multiplexer 641 selects and provides the output of the mixer unit 310 to the adder 610, and the second multiplexer 642 provides output of the shifter 630 or 'zero' to the adder 610. Each time a bit of the current volume level corresponds to '0', the first multiplexer provides a zero ('0') to the adder 610, and the second multiplexer 642 provides the output of the shifter 630 or '0' to the adder 610. The second multiplexer 642 provides '0' to the adder 610 before each bit becomes '1' for the first time. The second multiplexer 642 provides the output of the shifter 630 after the each bit becomes '1'.

Hereinafter, the operation of the scaler 321 according to one exemplary embodiment will be described in detail. For the convenience of description, it is assumed that the output 601 of the mixer unit 310 is 4-bit data corresponding to '1111', and the current volume level is 4-bit data corresponding to '1001'.

Initially, '1111' and '0000' are provided to the adder 610 though the first multiplexer 641 and the second multiplexer 642, respectively, because LSB of the current volume level corresponds to '1'. Thus, the adder 610 outputs '1111' and '1111' is stored in the register 620. Meanwhile, '0111' is outputted from the shifter 630.

'0000' and '0111' are provided to the adder 610 though the first multiplexer 641 and the second multiplexer 642, respectively, because second bit of the current volume level corresponds to '0'. Thus, the adder 610 outputs '0111' and '0111' is stored in the register 620. Meanwhile, '0011' is outputted from the shifter 630.

'0000' and '0011' are provided to the adder 610 though the first multiplexer 641 and the second multiplexer 642, respectively, because third bit of the current volume level corresponds to '0'. Thus, the adder 610 outputs '0011' and '0011' is stored in the register 620. Meanwhile, '0001' is outputted from the shifter 630.

'1111' and '0001' (output data of the shifter), are provided to the adder 610 though the first multiplexer 641 and the second multiplexer 642, respectively, because fourth bit (MSB) of the current volume level corresponds to '1'. Thus, the adder 610 outputs '10000' and '10000' is stored in the register 620. '1000' is outputted from the shifter 630. Bitwise operations upon LSB to MSB of the current volume level are finished. Therefore, data '1000' corresponding to MSB to the LSB of data stored in the register 620 is outputted as adjusted audio PCM data 304 after the multiplication.

Actually, '1111' multiplied by '1001' is to '10000111'. However, dividing '10000111' by '16', which removes 4 bits leaving 4 bits corresponding to the maximum output size of multiplier, provides '1000', which is the same result as the result obtained above.

In the exemplary embodiments illustrated in this description, the digital audio output device and the post-processor process two channel audio PCM data. However, the digital audio output device and the post-processor may also be adapted to process 5.1 channel audio data and other types of digital audio data. For example, a mixer unit including five buffers for storing 5.1 channel audio data temporarily, a calculator for generating mix data from the 5.1 channel audio data and at least one buffer for storing the mix data may be included in each post-processor.

As described above, a post-processor according to an exemplary embodiment of the invention reduces delay time for audio process because the post-processor processes digital audio data on the fly in response to the channel mode control signal and the volume level control signal. Additionally, the post-processor prevents audible clicking using a soft volume control technique.

When the digital audio data output device is implemented with the exemplary post-processor, time delay and FIFO memory required for audio processing may be reduced.

While the exemplary embodiments of the present invention have been described in detail, it should be understood that various changes, substitutions and alterations may be made herein without departing from the scope of the invention which is determined by following claims.

What is claimed is:

1. A digital audio data output device comprising:

an input unit configured to receive digital audio data;

a memory configured to buffer the received digital audio data temporarily;

first and second processors each configured to read the received digital audio data from the memory and process the read digital audio data; and first and second transmitters configured to output the digital audio data processed by the fi and second processors, respectively, in a predetermined transmission mode, wherein each of the first and second processors includes:

a mixer unit configured to process the received digital audio data in response to a channel mode control signal; and a volume control unit configured to adjust volume level of output of the mixer response to a volume level control signal, wherein the volume control unit operates in a soft volume control mode and includes a current volume level update unit configured to gradually change a current volume level with incremental step changes of volume amplitude until the current volume level corresponds to a target volume level.

2. The digital audio data output device of claim 1, wherein the digital audio data correspond to PCM data.

3. The digital audio data output device of claim 1, wherein the digital audio data correspond to two channel data, and wherein the mixer unit includes:

a first buffer configured to store the first channel data in the two channel data;

a second buffer configured to store the second channel data in the two channel data;

a calculator configured to calculate mix data from the output of the first buffer and the output of the second buffer; and an output unit configured to select and output one of the received digital audio data, the output of the first buffer, the output of the second buffer, and the mix data, as the output of the mixer unit.

4. The digital audio data output device of claim 3, further comprising a third buffer configured to store the mix data, and wherein the output unit is configured to select and output one of the received digital audio data, the output of the first buffer, the output of the second buffer, the mix data, and output of the third buffer as the output of the mixer unit.

5. The digital audio data output device of claim 1, wherein the volume control unit further comprises:

a current volume register configured to store the current volume level;

a target volume register configured to store the target volume level;

and a scaler configured to scale the output of the mixer unit according to the current level.

6. The digital audio data output device of claim 1, wherein the scaler includes a sequential multiplier configured to multiply the output of the mixer unit by the current volume level.

7. The digital audio data output device of claim 1, wherein the volume control unit includes a scaler including:

an adder configured to perform an addition operation first and second inputs of the adder in synchronization with a bit clock;

a register configured to store the output of the adder in synchronization with the bit clock; a shifter configured to perform 1-bit right shift of the output of the adder in synchronization with the bit clock; and a control unit configured to determine the first and second inputs of the adder according to each bit of the current volume level in sequence of LSB to MSB.

8. A digital audio data output device comprising:

an input unit configured to receive digital audio data;

a memory configured to buffer the received digital audio data temporarily;

first and second processors each configured to read the received digital audio data from the memory and the read digital audio data; and first and second transmitters configured to output the digital audio data processed by the first and second processors, respectively, in a predetermined transmission mode, wherein each of the first and second processors includes:

a mixer unit configured to process the received digital audio data in response to a channel mode control signal; and a volume control unit configured to adjust volume level of output of the mixer unit in response to a volume level control signal, wherein the volume control unit includes a scaler including:

an adder configured to perform an addition operation first and second inputs of the adder in synchronization with a bit clock;

a register configured to store the output of the adder in synchronization with the bit clock; a shifter configured to perform 1-bit right shift of the output of the adder in synchronization with the bit clock; and a control unit configured to determine the first and second inputs of the adder according to each bit of the current volume level in sequence of LSB to MSB, and wherein:

when the each bit of the current volume level corresponds to '1', the output of the mixer unit is selected as the first input of the adder and one of the output of the shifter or ‘zero’ is selected as the second input of the adder; and when the each bit of the current volume level corresponds to ‘0’, ‘zero’ is selected as the first input of the adder, and one of the output of the shifter or ‘zero’ is selected as the second input of the adder, wherein the control unit selects ‘zero’ as the second input of the adder before any bit of the current volume level corresponds to ‘1’, and the control unit selects the output of the shifter as the second input of the adder while and after any bit of the current volume level corresponds to ‘1’.

* * * * *